United States Patent [19]

Matsui

[11] Patent Number: 4,894,691
[45] Date of Patent: Jan. 16, 1990

[54] COMPOUND SEMICONDUCTOR DEVICE WITH SUPERLATTICE CHANNEL REGION

[75] Inventor: Yuichi Matsui, Osaka, Japan

[73] Assignee: Sumitomo Electric Industries, Ltd., Osaka, Japan

[21] Appl. No.: 42,330

[22] Filed: Apr. 24, 1987

[30] Foreign Application Priority Data

Apr. 30, 1986 [JP] Japan .................................. 61-99928

[51] Int. Cl.$^4$ .................... H01L 29/205; H01L 29/80
[52] U.S. Cl. ........................................ 357/22; 357/16; 357/4
[58] Field of Search ................................ 357/4, 22, 16

[56] References Cited

U.S. PATENT DOCUMENTS

| 4,194,935 | 3/1980 | Dingle et al. | 357/4 |
|---|---|---|---|
| 4,688,061 | 8/1987 | Sakaki | 357/16 |
| 4,697,197 | 9/1987 | Dresner | 357/4 |
| 4,797,716 | 1/1989 | Chaffin et al. | 357/16 |

OTHER PUBLICATIONS

Tamargo et al., *Appl. Phys. Lett.* 46 (6) 15 Mar. 85, pp. 569–571, "Growth of a Novel InAs–GaAs . . . ".
Zipperian et al., "An In$_2$Ga$_2$As/GaAs . . . Transistor", *Int. Elec. Dev. Meet.* 1983, Wash. D.C., pp. 696–699.
Milnes, "Semiconductor . . . Overview", *Solid State Electronics*, vol. 29, No. 2, pp. 99–121, 1986 Feb.
Bhattacharya et al., "Material . . . Review", *Solid State Electronics*, vol. 29, No. 2, pp. 261–267, Feb. 1986.

*Primary Examiner*—Andrew J. James
*Assistant Examiner*—Jerome Jackson
*Attorney, Agent, or Firm*—Kenyon & Kenyon

[57] ABSTRACT

A compound semiconductor device having a channel layer which is made of periodically laminated structure of thin-film layers of compound semiconductor substantially being different from each other. The difference of energy between the conduction band and the valence band of compound semiconductor thin-film layers of one side is less than that of the other side thin-film layers, moreover the electron mobility in low electric field application in the thin-film layers of compound semiconductor of one side is greater than that of the other side thin-film layers, besides the electron mobility in high electric field application in the thin-film layers of compound semiconductor of one side is less than that of the other side thin-film layers, and/or the impact ionization of valence electron generated in high electric field application takes place earlier than the thin-film layers of compound semiconductor of the other side. While conduction electron preferentially flows through the thin-film layers of compound semiconductor of one side in low electric field application, and conversely, while conduction electron having substantial energy intensified by acceleration preferentially flows through other side thin-film layers in high electric field application.

15 Claims, 7 Drawing Sheets

COMPOUND SEMICONDUCTOR DEVICE WITH SUPERLATTICE CHANNEL REGION

BACKGROUND OF THE INVENTION

The present invention relates to a compound semiconductor device, and more particularly, to a compound semiconductor device specially suited for manufacturing component devices of integrated circuits (IC) and large-scale integrated circuits (LSI) compound semiconductor devices such as field effect transistors (FET), high electron movement transistors (HEMT) and the like.

For fabricating compound semiconductor devices, particularly electronic devices, the epitaxial growth method is generally employed owing to the thin and uniform growth of layers and ease of control of constituent element composition ratio. Also, the molecular beam epitaxial (MBE) growth method is one of the more particularly discussed techniques recently. For example, a device utilizing the MBE growth method and thin layer periodic structure is described in detail by W. T. Tsang in Nikkei Electronics No. 308, 163 (1983).

According to this MBE growth method, the crystal growth speed can be controlled on a single atomic plane level (see J. P. van der Ziel et al., J. Appl. Phys., 48 (1977), p. 3018), and, furthermore, when combined with the reflective electron diffraction method, the composition of one atomic plane can be accurately controlled (see J. H. Neave et al., Appl. Phys. A. 31, 1, 1983).

By employing such an MBE growth method, it is possible to fabricate a high electron mobility transistor (HEMT) like that shown in FIG. 10.

Incidentally, microwave elements using conventional compound semiconductors are disclosed, for example, in the Japanese Unexamined Patent Publication Nos. 4085/1984 and 147169/1983.

In the HEMT structure shown in FIG. 10, a GaAs layer 12 functioning as a buffer layer is formed on a semi-insulating GaAs substrate 11, and an undoped GaAs layer 13 serving as a channel layer is formed thereon. On the undoped GaAs layer 13 is formed an electron supply layer 14 having a high impurity concentration such as n-$Ga_xAl_{1-x}As$. In the middle of the electron supply layer 14 there is a layer 15 made of a semiconductor containing p-type impurities at high concentration and possessing a large electrophilic ability, while a gate electrode 16 is disposed on this layer 15. Furthermore, the surface region 17 of the electron supply layer 14 at both sides of the layer 15 is alloyed, and source and drain electrodes 18 are formed thereon.

In the thus composed semiconductor device, when a proper bias voltage is supplied to the gate electrode 16, a two-dimensional electron gas 19 is formed at the channel layer 13 side of the interface of the electron supply layer 14 and the channel layer 13. As a result, many electrons flow within a channel a few tens of angstrom units in thickness near the interface in the channel layer 13 where only few impurity ions are present. Therefore, there is less scattering of impurity ions which is one of the major causes of limiting of the electron mobility, so that a high electron mobility may be realized.

However, when operating such a conventional compound semiconductor device having the typical constitution mentioned above, the electron mobility is extremely dependent on the intensity of the electric field applied to the two-dimensional electron gas. High electron mobility is realized in low electric field application, and conversely the electron mobility is lower in high electric filed application. This phenomenon is described by M. Hnoue et al. in J.J.A.P.22 357 (1983) for example. FIG. 11 shows one of these examples related to the constitution of the above-mentioned microwave element containing GaAs/n—$Ga_xAl_{1-x}As$, in which the above phenomenon is expressed by the broken-line curve.

Generally, those phenomena (including inter-valley scattering, impact ionization, or phonon scattering) respectively cause electron scattering in a semiconductor device in high electric field applications. Consequently, those characteristics specified below of the semiconductor crystals used for channel layers of ultra-high-frequency transistors should be improved.

(1) To prevent inter-valley scattering from occurring, a greater value of energy difference $\Delta E$ should be provided between valleys of space $\kappa$.

(2) To prevent impact ionization from occurring, a greater value should be provided for energy gap Eg.

(3) To minimize loss of operating energy of carrier electrons caused by phonon scattering, a lesser value should be provided for effective mass m*.

FIG. 7 shows an example of the energy band structure of GaAs crystals in conjunction with parameters of energy difference $\Delta E$ between valleys and energy gap Eg.

Conventionally, GaAs, InP, and $In_{0.53}Ga_{0.47}As$ respectively make up compound semiconductors for composing channel layers of conventional FET and HEMT. Table 1 represents approximate values of energy difference $\Delta E$ between valleys, energy gap Eg, and the effective mass m* of electrons of those compound semiconductors mentioned above. For reference to the later description, data related to InAs and InSb are also shown in Table 1. Note that the energy difference between valleys of $In_{0.53}Ga_{0.47}As$ is not yet known.

TABLE 1

| Elements | Energy gap Eg (eV) (300k) | Energy difference between valleys (eV) | | Effective Mass m* |
|---|---|---|---|---|
| | | $E_{\Gamma L}$ | $E_{\Gamma X}$ | |
| GaAs | 1.428 | 0.294 | 0.46 | 0.065 |
| InP | 1.351 | 0.5 | 0.85 | 0.077 |
| InAs | 0.356 | 0.78 | 1.47 | 0.027 |
| $In_{0.53}Ga_{0.47}As$ | 0.75 | — | — | 0.041 |
| InSb | 0.18 | 1.67 | 2.03 | 0.016 |

As is clear from Table 1, if the channel layer is composed of GaAs compound, since there is a large energy gap Eg, impact ionization rarely takes place in high electric field application. Conversely, due to the small energy difference $\Delta E$ between valleys, inter-valley scattering easily takes place. Furthermore, since the effective mass m* of electrons inherent to GaAs is great, a greater amount of operating energy of electrons is lost by phonon scattering, thus preventing electrons from flowing faster. On the other hand, if the channel layer is composed of InP compound, due to substantial values of energy gap Eg, and energy differences $E_{\Gamma L}$, $E_{\Gamma X}$ between valleys inherent to InP, neither impact ionization nor inter-valley scattering easily occurs in high electric filed application, thus allowing electrons to flow at a faster speed. Conversely, since the effective mass m* of electrons inherent to InP is great, electrons are presented from flowing at a faster speed in low electric field application. On the other hand, if the channel layer is composed of compound semiconductors made from InAs or InSb, due to the small amount of effective mass m*, electrons flow at an extremely fast speed in low electric field application. Conversely, since the energy gap Eg is small, impact ionization easily occurs in high electric field application. For example, impact ionization occurs in the compound semiconductor made of InAs in about 3.3 KV/cm electric field application. Further, if the channel layer is composed of compound semiconductors made of the mixed crystals of $In_{0.53}Ga_{0.47}As$, this mixture exhibits a specific characteristic which is between those of compound semiconductors made of InAs and compound semiconductors made of GaAs. Those features thus far described above are readily identified by referring to FIG. 12 showing the results of tests and theoretical development in conjunction with the dependency of the drift speed of electrons present in compound semiconductors on the intensity of electric field applied thereto. Results of evaluating the characteristic of compound semiconductors made of GaAs are cited by Ruch. J.G. and Kino G.S. in the Phys. Rev., 174, 921 (1969), and by Houston P.A. et al. in Solid State Comm., 20,197 (1977), respectively. Likewise, results of evaluating the characteristic of compound semiconductors made of InP are cited by Nelsen L.D. in the Phys. Lett., A38, 221 (1972) and Boers P.M. in the Electron Lett., 7, 625 (1971), respectively. Results of evaluating the characteristic of compound semiconductors made of InAs are cited by Itoh et al. in the report ED83-77, (1983) presented to Electronic Communication Society of Japan. Covering the results of evaluating the characteristic of compound semiconductors made of InSb, refer to the reports presented by Glicksman M. et al. in the Phys. Rev., 129, 1572 (1963), Neukermans A. et al. in the Appl. Phys. Lett., 17, 102 (1970), and Smith J. et al. in the Appl. Phys. Lett., 37, 797 (1980), respectively. Results of evaluating the characteristic of compound semiconductors made of mixed crystals of $In_xGa_{1-x}As$ are cited by Itoh et al. in the report ED83-77, (1983) presented to Electronic Communication Society of Japan.

Generally, when operating either an FET or an HEMT, since either of these is subjected to several kilovolts per centimeter of electric field, any of these transistors having a conventional structure using channel layers made of InAs or InSb which easily allow occurrence of impact ionization in low electric field incurs many disadvantages. Actually, there is no satisfactory FET incorporating channel layers made of either InAs or InSb. In other words, any of these conventional transistors cannot effectively apply advantageous characteristics of InAs or InSb which allows electrons to flow at an extremely fast speed in low electric field application. Although not shown in FIG. 12, those compound semiconductors made of mixed crystals of $In_xGa_{1-x}As$ ($0<y<1.0$) vary their dependency of the electron mobility on the intensity of electric field according to values of x and y. However, the electron mobility in low electric field application of these compound semiconductors is lower than the electron mobility of those which are made of InAs. Yet, the electron mobility of these is also lower than the electron mobility of those compound semiconductors which are made of either GaAs or InP in high electric field application.

In order to manufacture high-performance transistors featuring faster operating speeds and more satisfactory characteristics, such transistors should allow electrons to flow at an extremely fast speed even in low electric field application. Taking this into account, neither GaAs having the low electron mobility in high electric field application nor InP having the low electron mobility in low electric field application is ideally suited for making up channel layers.

A study on a new constitution called a "super-lattice constitution" has been underway, the detail of which is presented by L. Esaki, R. Tsu; IBM J. Res. Develop. (1970) P 61 for example. As shown in FIG. 8, using an adequate growth system like MBE growth method for example, thin-film layers made of compound semiconductors comprising different components like GaAs and AlAs for example are alternately and periodically laminated. By comparative evaluation of bulk crystals, specifically quantized levels are then generated in the thin-film layers in the lower portions of the conduction bank (which are substantially layers A shown in FIG. 8 and are hereinafter called "well layers"). Although FIG. 8 shows only two levels 1 and 2, in actuality, the number and the energy of the level are variably dependent on the thickness LW of the well layer, the thickness LB of the barrier layer corresponding to the layer B shown in FIG. 8, and the difference between the bottoms of the conduction band of layers A and B as the bulk crystals, respectively.

Furthermore, the probability of the presence of electrons in these quantized levels is described by M. Jaros, K.B. Wong; J. Phys. C: Solid State Phys., 17 (1984) L765 for example. Assume that the barrier layer is made of $Ga_{0.8}Al_{0.2}As$ and the well layer is made of GaAs, then, as shown in FIG. 9-a, only the quantized levels 1 and 2 can be confined inside of the GaAs layer, whereas the high-energy level above level 3 exceeds the barrier height EB of the barrier layer made of $Ga_{0.8}Al_{0.2}As$. FIG. 9-b denotes that there is the greater probability of the presence of electrons on the side of the GaAs layer at levels 1 and 2 when the above condition is present. Conversely, there is the greater probability of the presence of electrons inside of the layer made of $Ga_{0.8}Al_{0.2}As$. The probability of the presence of electrons is varied by varying the thickness of the barrier layer and the well layer as well as the height of the barrier. More particularly, as is clear from FIG. 9, there is the significantly greater probability of the presence of those electrons having a greater amount of energy than the barrier energy in the $Ga_{0.8}Al_{0.2}As$ layer than those electrons which move through the GaAs layer. However, since the electron mobility inside of the $Ga_xAl_{1-x}As$ layer of the periodical thin-film constitution made of mixed crystal of GaAs and $Ga_xAl_{1-x}As$ is significantly low both in high and low electric field application, when the high electric field is applied, the electron mobility inside of the $Ga_xAl_{1-x}As$ layer becomes lower than that of the GaAs layer measured in the same intensity of electric field.

Taking the above conditions into account, the present inventor detected that specific energy bank structure identical to those which are shown in FIGS. 8 and 9 could be generated by making up the well layer using either InAs or InSb and the barrier layer by using either InP or GaAs. First, when making up the well layer and the barrier layer by using InAs and InP, respectively, the present inventor detected that the quantized level could be formed inside of the InAs layer. The present inventor also detected that only the low-energy levels 1 and 2 could be confined in the InAs layer, whereas the high-energy level 3 could be raised to a point higher than the barrier height EB between InP and InAs as shown in FIG. 9. As a result, since the effective energy gap Eg inside of the InAs layer is equal to the difference between the quantized level 1 inside of the conduction band and the quantized level 1 inside of the valence band shown in FIG. 8, this energy gap becomes greater than the essential energy gap Eg of the InAs crystal. Consequently, as described earlier, impact ionization cannot easily take place, thus allowing high electric field of greater magnitude to be applied. Alternatively, in the presence of a specific intensity of electric field prior to the occurrence of impact ionization, the probability of the presence of highly energized electrons can significantly grow on the part of the InP layer (refer to the state of level 3 shown in FIG. 9).

Consequently, it is possible for the InAs layer to securely prevent impact ionization from internally taking place. In addition, since those electrons transmitted into the InP layer in high electric field application follow the electric characteristic of the InP layer in high electric field application, as shown in FIG. 12, electrons flow through the InP layer at a speed faster than that of those electrons flowing through other crystals even when high electric field is applied. In other words, in low electric field application, since electrons are confined inside of the InAs layer, electrons flow at a speed faster than those electrons flowing through the GaAs and InP bulk crystals. Yet, since highly-energized electrons flow into the InP layer in high electric field application, electrons are allowed to flow at a speed faster than those which flow through the GaAs crystal.

SUMMARY OF THE INVENTION

This invention is contrived in the light of the above problems, and it is therefore an object of this invention to present a novel compound semiconductor device having a channel layer made of periodically laminated thin-film capable of moving electrons at an extremely fast speed independent of the intensity of the electric field.

Another object of the invention is to provide a novel compound semiconductor device having a channel layer made of periodically laminated thin-film which prevents occurrence of inter-valley scattering and impact ionization.

To achieve the above objects, the compound semiconductor device according to this invention comprises a channel layer made of periodically laminated compound semiconductor thin-films which are substantially different from each other. The energy difference between the conduction band and the valence band of the compound semiconductor thin-film layers of a first type making up the channel layer is less than that of the compound semiconductor thin-film layers of the second type. Moreover, the electron mobility in low electric field application of the first type of the compound semiconductor thin-film layers is greater than that of the second type, and the electron mobility in high electric field application is less than that of this second type of the compound semiconductor thin-film layers. The impact ionization of the valence electron generated in high electric field application takes place earlier than for the second type compound semiconductor thin-film layers.

The energy difference between the conduction band and the valence band of the second type compound semiconductor thin-film layers is less than that of the first type compound semiconductor thin-film layers. Yet, the electron mobility in high electric field application is greater than that of the second type thin-film layers. When low electric field is applied, conduction electrons preferentially flow through the first type compound semiconductor thin-film layers, whereas the highly-energized conduction electrons by acceleration preferentially flow through the second type compound semiconductor thin-film layers. Furthermore, before causing conduction electrons to generate impact ionization of valence electrons and inter-valley scattering in the conduction band of conduction electrons in the compound semiconductor thin-film layers of the first type, conduction electrons which are highly energized by acceleration generated by the applied high electric field are allowed to smoothly move from compound semiconductor thin-film layers of the first type to the second type compound semiconductor thin-film layers.

The compound semiconductor thin-film layers of the second type may contain doped n-type impurities. Furthermore, the compound semiconductor thin-film layers of the first type may be compound semiconductors made of InAs or InSb, whereas the compound semiconductor thin-film layers of the second type may be compound semiconductors made of InP or GaAs, respectively. Alternatively, compound semiconductor thin-film layers of the first type may be compound semiconductors made of mixed crystals of $In_xGa_{1-x}As$ ($0<x<1.0$), whereas compound semiconductor thin-film layers of the second type may be made of InP. Furthermore, compound semiconductor thin-film layers of the first type may be compound semiconductors made of either InAs or InSb, whereas compound semiconductor thin-film layers of the second type may be compound semiconductors made of mixed crystals of $InAs_yP_{1-y}$ ($0<y<1.0$). Alternatively, compound semiconductor thin-film layers of the first type may be compound semiconductors made of mixed crystals of $InAs_yP_{1-y}$ ($0.5<y<1.0$), whereas the second type compound semiconductor thin-film layers may be compound semiconductors made of mixed crystals of $InAs_yP_{1-y}$ ($0<y<0.5$).

Since the compound semiconductor device related to this invention featuring the constitution mentioned above is made up of channel layers by periodically laminating compound semiconductor thin-film layers of the first type and the second type compound semiconductor thin-film layers, it is possible for the device to effectively generate an energy gap having a specific magnitude enough to prevent impact ionization from occurrence in the compound semiconductor thin-film layers of the first type, and/or promote the probability of the presence of highly energized electrons enough to completely prevent impact ionization from occurrence in the compound semiconductor thin-film layers of the second type.

Furthermore, since the device related to this invention causes conduction electrons to be confined in the compound semiconductor thin-film layers of the first type in low electric field application in order that the conduction electrons can preferentially flow through the compound semiconductor thin-film layers of the first type, these conduction electrons are allowed to move at a significantly accelerated speed. Likewise, since the device related to this invention allows the highly energized conduction electrons to preferentially flow through the second type compound semiconductor thin-film layers after being accelerated by the applied high electric field, the mobility of these electrons can eventually and significantly be accelerated.

In particular, before causing the conduction electrons to generate impact ionization of valence electrons and before occurrence of inter-valley scattering in the conduction band by the conduction electrons, the device related to this invention allows the highly energized conduction electrons accelerated by the applied high electric field to move from the compound semiconductor thin-film layers of the first type to the second type compound semiconductive thin-film layers, and as a result, the conduction electrons can preferentially flow through the second type compound semiconductor thin-film layers at a significantly accelerated speed.

BRIEF DESCRIPTION OF THE DRAWINGS

The invention will be better understood from the detailed description given hereinbelow and the accompanying drawings which are given by way of illustration only, and this are not limiting of this invention in which.

DESCRIPTION OF THE PREFERRED EMBODIMENTS

Referring now more particularly to the accompanying drawings, one of the preferred embodiments of this invention is described below.

Figure 1:
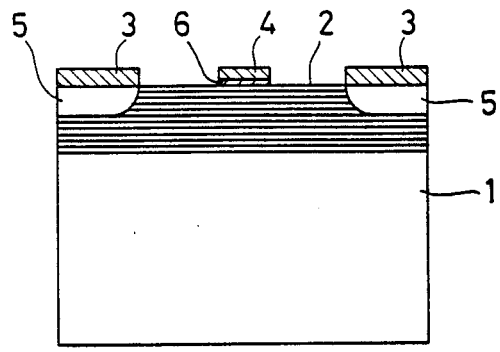
FIG. 1 is a sectional diagram denoting a preferred embodiment of a FET as the compound semiconductor device related to the invention.

FIG. 1 represents a novel FET related to this invention incorporating a channel layer comprising a crystalline compound semiconductor multiple thin-film layer 2 containing six layers each of InAs and InP alternately laminated by about 69Å and about 100Å on a semiinsulated InP substrate 1. The multiple thin-film layer 2 has about 0.1 μm thickness as a whole, and is formed on the semiinsulated InP substrate 1 by applying the MBE growth method.

The surface of the multiple thin-film layer 2 is provided with evaporated AuGeNi ohmic junction electrodes 3, to form the source electrode and drain electrode. The gate electrode 4 for the FET is the Al Schottky junction electrode provided on the insulated layer 6 by evaporation.

Due to the evaporation and alloying processes performed for generating the AuGeNi ohmic junction electrode 3, the Au atoms diffuse throughout the crystalline multiple thin-film layer 2 of compound semiconductor. As a result, the periodic characteristic of the layer structure in the compound semiconductor crystalline multiple thin-film layer 2 goes out of order, thus causing the crystalline structure in an area 5 to eventually become identical to the conventional $InAs_yP_{1-y}$ mixed crystal. Consequently, the energy band structure in this area 5 also becomes identical to that of the conventional $InAs_yP_{1-y}$ mixed crystal. When these phenomena took place during tests, the inventor smoothly formed ohmic junctions. N. Holonyak et al. already announced similar phenomenon in which the diffusion of the atoms caused the destruction of the periodic characteristic of the layer structure of compound semiconductor multiple thin-film layers in A.P.L. 39 (1981) 102.

By applying conventional techniques for making up conventional FET structures, the inventor confirmed that the source electrode 3, drain electrode 3, and the gate electrode 4 shown in FIG. 1 properly executed functions needed for an FET.

Figure 2:
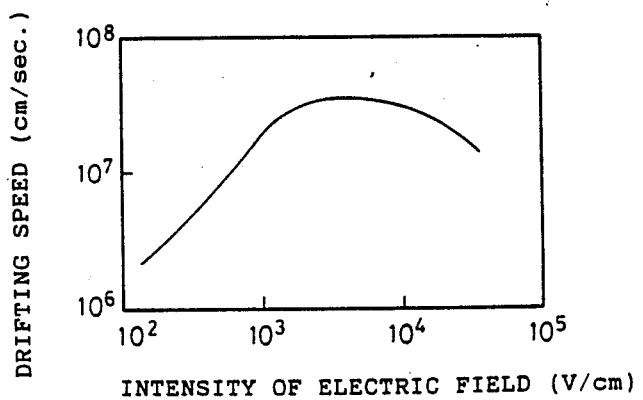
FIG. 2 is a chart illustrating the dependency of the drifting speed of electrons in the FET shown in FIG. 1 on the intensity of the applied electric field.
Figure 12:
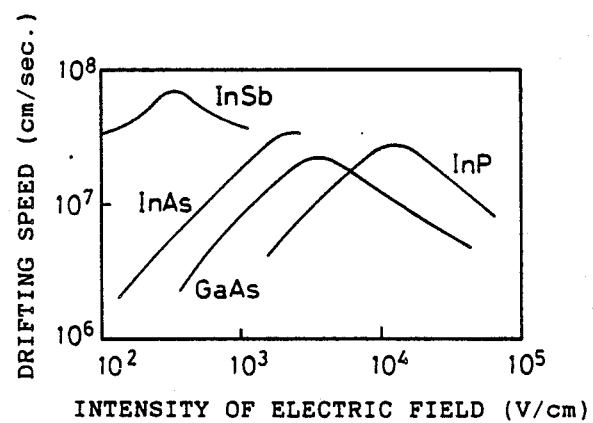
FIG. 12 is a chart illustrating the dependence of the drifting speed of electrons of a variety of conventional compound semiconductors on the intensity of the applied electric field.

FIG. 2 is a chart illustrating the dependency of the drifting speed of electrons inside of the multiple thin-film layer 2 shown in FIG. 1 on the intensity of the applied electric field. As is clear from the comparison to FIG. 12, while low electric field is applied, the multiple thin-film layer 2 allows electrons to flow at a specific speed almost corresponding to that which is available inside of InAs. In addition, the multiple thin-film layer 2 doesn't cause impact ionization to occur even when high electric field is applied, while allowing electrons to flow at a specific speed almost corresponding to that which is available inside of InP. In other words, by implementing the multiple thin-film layer constitution shown in FIG. 1, the dependence of the electron mobility on the intensity of electric field is significantly improved. In addition, by varying the thickness of the InAs thin-film layer from about 24A to about 75A, the inventor observed satisfactory effects corresponding to those which are mentioned above. The inventor confirmed the dependency of the drifting speed of electrons on the applied electric field by providing InAs layers with thicknesses of about 21Å, 24Å, 45Å, 75Å, and 78Å (refer to e, c, b, a, and d shown in FIG. 3) against the thickness of the InP layer of about 100Å. When the InAs layer had a thickness of about 21Å, electrons flowed at a low speed in low electric field application. Conversely, when the InAs layer had a thickness of about 78Å, the drifting speed of electrons was increased until the applied electric field rose to a certain level. When the applied electric field exceeded a certain critical level, the specimen was eventually destroyed. Taking this into account, the dependency of the electron mobility on the applied electric field can securely be improved by setting the thickness of the InAs layer at a certain value between about 24Å and a maximum of 75Å. It was probable that, since the InAs layer had too large a thickness, a preferential flow of electrons inside of the InP layer didn't occur even when a high electric field was applied, thus causing a large amount of current to flow through only the InAs layer to eventually destroy the specimen.

Figure 3:
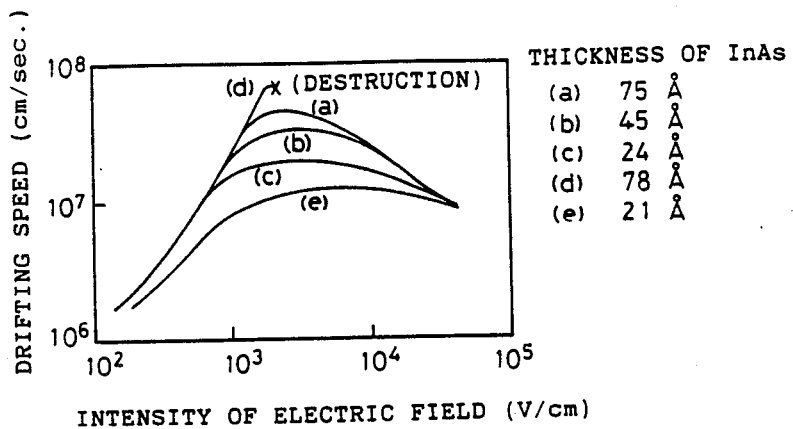
FIG. 3 is a chart illustrating the dependency of the drifting speed of electron on the intensity of the applied electric field when varying the thickness of the well layer comprising InAs against the barrier layer comprising InP.

Although the above preferred embodiment employed a well layer and a barrier layer respectively composed of InAs and InP, the inventor also achieved the identical effect by employing a well layer and a barrier layer respectively composed of InAs and GaAs. Use of these layers composed of the InAs and GaAs components resulted in the lowered electron mobility in high electric field application, which was slower than those which are shown in FIGS. 2 and 3, while the electron mobility became almost equal to that which was observed from the GaAs bulk crystal. This characteristic was observed only when the thickness of the InAs layer was varied from about 24Å to about 60Å.

Figure 4:
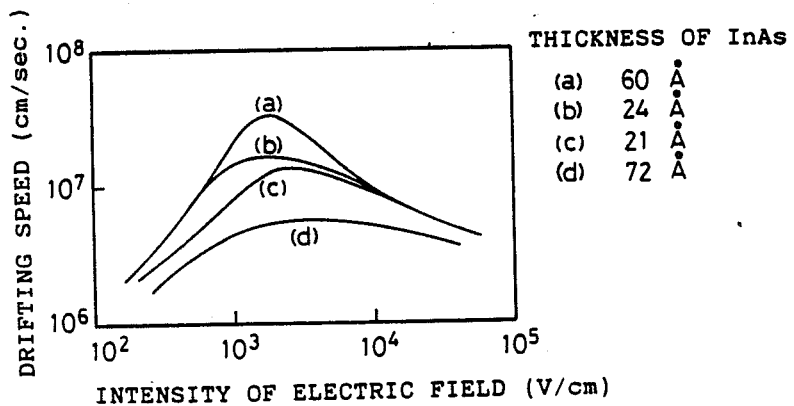
FIG. 4 is a chart illustrating the dependency of the drifting speed of electrons on the intensity of the applied electric field when varying the thickness of the well layer comprising InAs against the barrier layer comprising GaAs.

FIG. 4 is a chart denoting the result of evaluating the dependency of the drifting speed of electrons on the applied electric field when employing the well layer and the barrier layer respectively composed of InAs and GaAs. The inventor confirmed the results shown in FIG. 4 by evaluating the dependency of the drifting speed of electrons on the applied electric field by providing a thickness of the InAs layer of about 21Å, 24Å, 60Å, and 72Å (refer to c, b, a, and d) against the thickness of the GaAs layer at about 50Å. When the InAs layer has a thickness of about 21Å under low electric field, electrons flow at a low speed in low electric field application, and therefore, the InAs layer should be provided with a minimum thickness of about 24Å.

According to the test results, when the InAs layer had a thickness of about 72Å, a variety of defects took place with the specimen due to the unsatisfactory surface condition of the tested specimen. However, the specimen generated a mirror surface when the InAs layer had thicknesses of about 21A, 24A, and 60Å, respectively. Taking this into account, the dependency of the electron mobility on the applied electric field can securely be improved by providing the thickness of the InAs layer from about 24Å to about 60Å.

Regarding the multiple thin-film layer 2 of the FET shown in FIG. 1, when using well layers which comprise $In_{0.53}Ga_{0.47}As$ and are provided with a thickness at a minimum of about 68Å against a barrier layer comprising InP, the inventor confirmed that the electron mobility in a high electric field application was almost equal to that shown in the InP.

Figure 5:
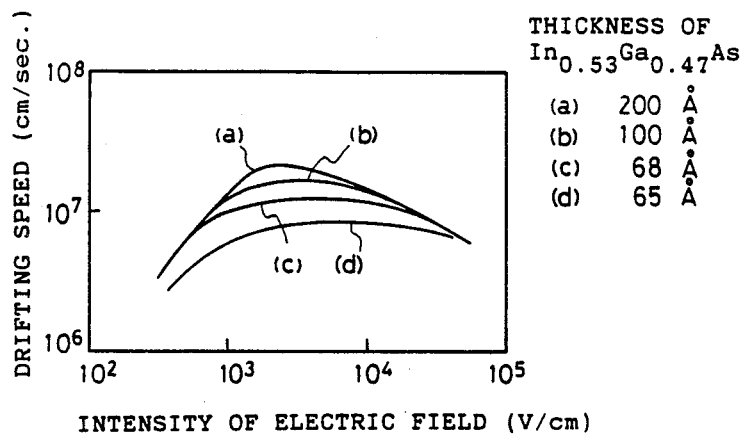
FIG. 5 is a chart illustrating the dependency of the drifting speed of electrons on the intensity of the applied electric field when varying the thickness of the well layer comprising $In_{0.53}Ga_{0.47}As$ against the barrier layer comprising InP.

FIG. 5 is a chart showing the dependency of the drifting speed of electrons on the applied electric field when employing a well layer and a barrier layer respectively comprising $In_{0.53}Ga_{0.47}As$ and InP. The inventor confirmed the dependency of the drifting speed of electrons on the applied electric field by providing the thickness of the $In_{0.53}Ga_{0.47}As$ layer to be about 65Å, 68Å, 100Å, and 200Å (refer to d, c, b, and a shown in FIG. 4) against the thickness of the InP layer of about 100Å. When the layer comprising $In_{0.53}Ga_{0.47}As$ had a thickness of about 65Å, the drifting speed of electrons slowed down in a low electric field application, and thus, the $In_{0.53}Ga_{0.47}As$ layer should be provided with a minimum thickness of about 68Å.

When using the well layer comprising InSb against the barrier layer comprising GaAs or InP, the inventor confirmed that a satisfactory result identical to that of FIG. 2 was obtained. When a low electric field was applied, electrons flowed at a speed almost equal to the electron mobility inside of the InSb. Likewise, when a high electric field was applied, electrons flowed at a speed almost equal to the electron mobility inside of GaAs or InP. It was also confirmed from these experiments that impact ionization was completely prevented from occurrence inside of the InSb layer.

The invention also provides other compositions, in which the well layer may comprise either InAs or InSb and the barrier layer may also comprise $InAs_yP_{1-y}$ ($0<y<1.0$). In addition, the well layer may also comprise $InAs_yP_{1-y}$ ($0.5<y<1.0$) and the barrier layer may also comprise $InAs_yP_{1-y}$ ($0<y<0.5$).

As a result of doping n-type impurities such as silicon (Si), tin (Sn), tellurium (Te), and the like against only the barrier layer portions of all those combinations mentioned above, the inventor successfully promoted the electron mobility by 20% through a maximum of 50% in low electric field application.

Figure 6:
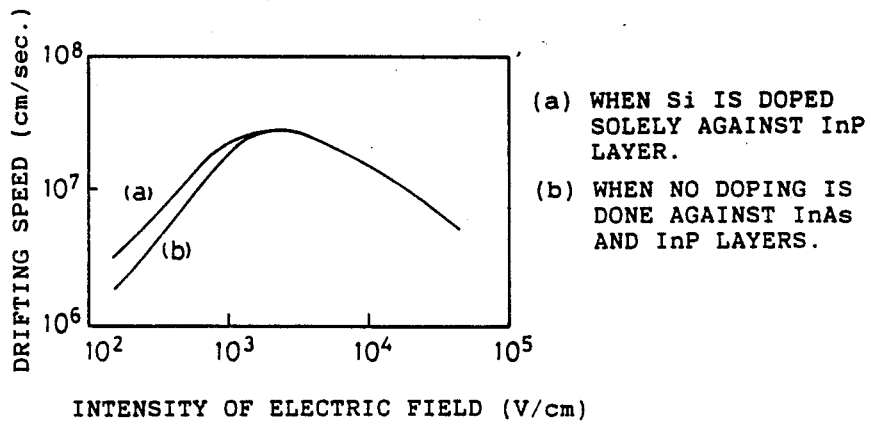
FIG. 6 is a chart illustrating the dependency of the drifting speed of electrons when silicon is doped against the barrier layer comprising InP against the well layer comprising InAs and also when neither of these layers is doped with silicon.
Figure 7:
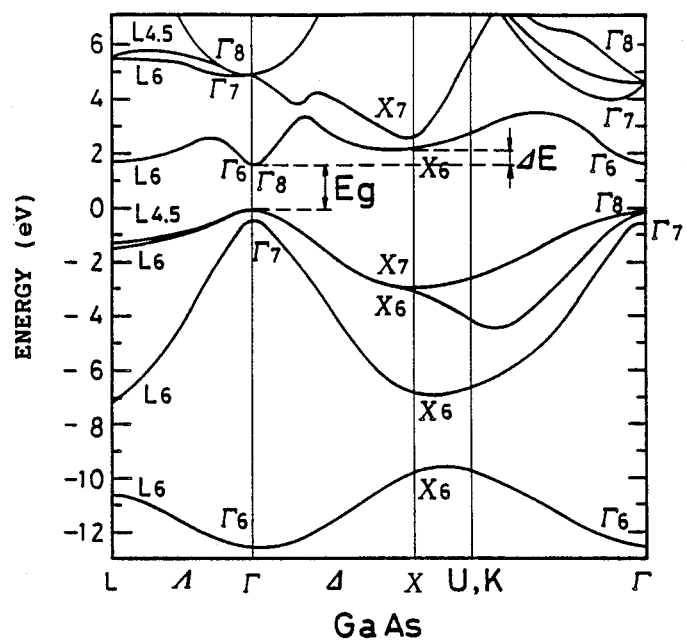
FIG. 7 is a chart denoting the energy band constitution of the compound semiconductor.
Figure 8:
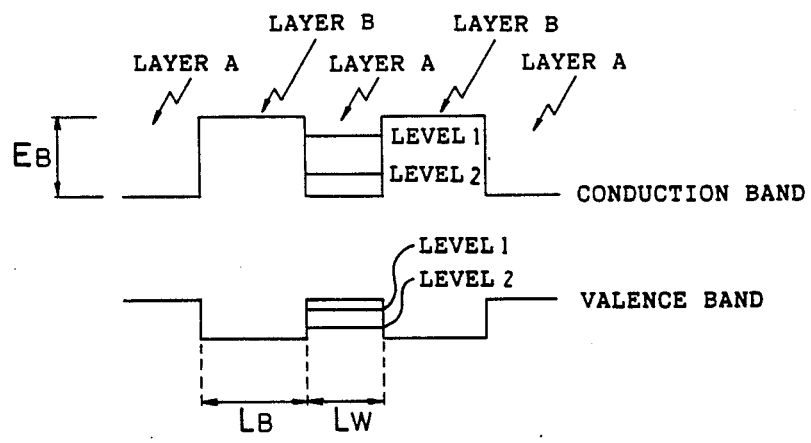
FIG. 8 is a chart of energy composition for explaining the quantized level.
Figure 9:
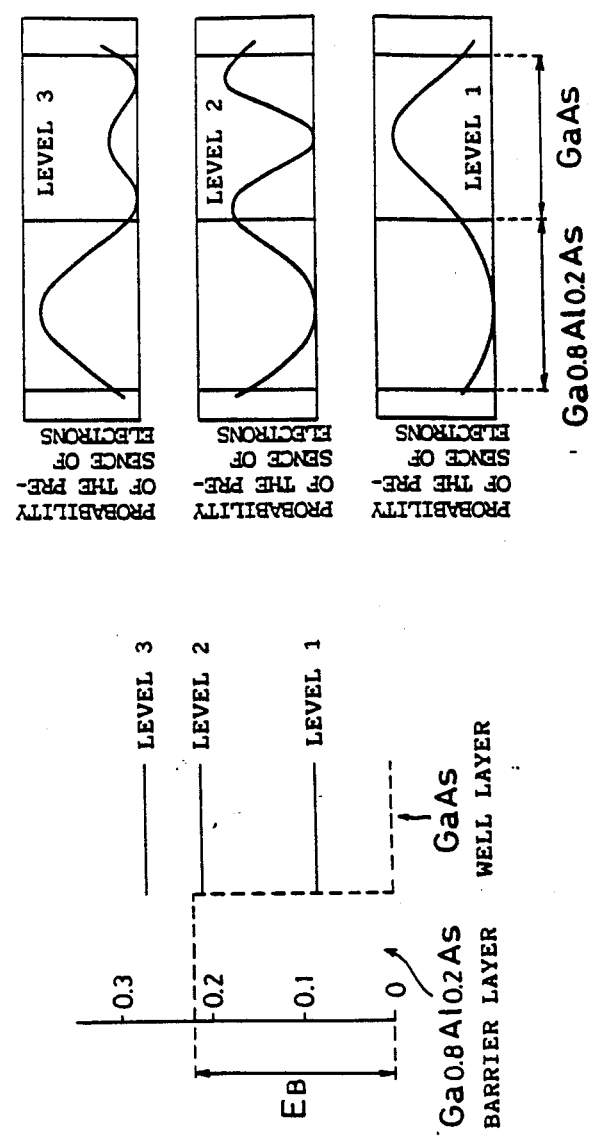
FIG. 9 are 9A-9b a chart explaining the phenomenon in which highly energized electrons travel from the well layer to the barrier layer.
Figure 10:
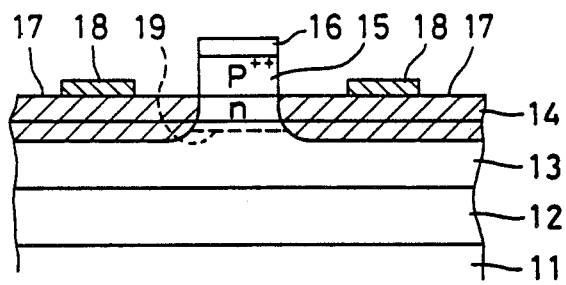
FIG. 10 is a simplified sectional diagram of a conventional HEMT.
Figure 11:
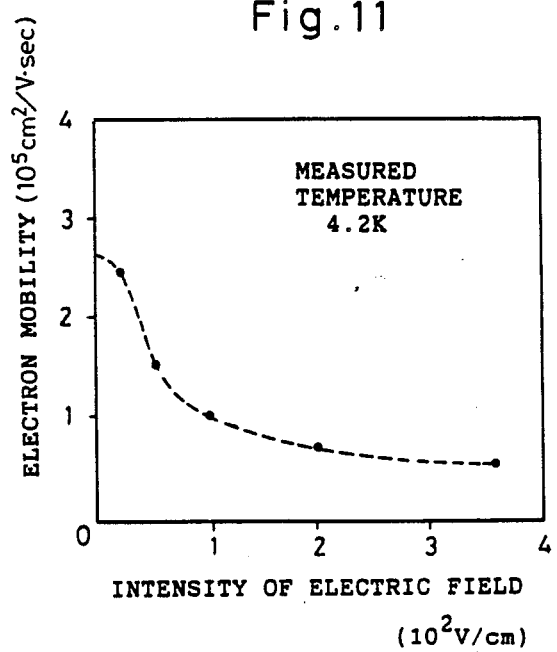
FIG. 11 is a chart illustrating the dependency of the electron mobility on the intensity of the applied electric field proper to a conventional HEMT.

FIG. 6 is the chart illustrating the dependency of the drifting speed of electrons on the intensity of the applied electric field when using a well layer comprising InAs crystal having a thickness of about 75Å and a barrier layer of InP crystal having a thickness of about 100Å. Reference character "a" in FIG. 6 indicates the result of the doping of silicon against only the InP layer portion, whereas reference character "b" indicates the result without doping silicon against both the InAs and InP layers. By referring to these results, the inventor eventually confirmed the effect described above.

As is clear from the foregoing description of the preferred embodiments of this invention, the thickness of the entire channel layer can be set in the submicron order. Accordingly, by effectively applying those constituents of the preferred embodiments to a variety of compound semiconductor devices for making up IC and LSI, it is possible for all the electronic elements to securely accelerate their operational speed independent of variable conditions of the applied electric field.

Although the foregoing description of the preferred embodiments totally refers to the use of FET, it is obvious for those skilled in the art that the constituents of the invention can securely generate the same characteristics as the above by effectively being applied to other compound semiconductor devices like HEMT and others.

What is claimed is:

1. A compound semiconductor device incorporating a channel layer coupled to a source electrode and a drain electrode and which is made of periodically layering compound semiconductor thin-film layers substantially being different from each other comprising;
   a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, a specific electron mobility which is less than that of the second type of the compound semiconductor thin-film layers in high electric field application, and causes impact ionization of valence electrons to occur at lower electric field application than the second type of said compound semiconductor thin-film layers; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through said second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of either InAs or InSb compound semiconductor, whereas the second type of said compound semiconductor thin-film layers are substantially composed of InP compound semiconductor.

2. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, a specific electron mobility which is less than that of the second type of the compound semiconductor thin-film layers in high electric field application, and causes impact ionization of valence electrons to occur at lower electric field application than the second type of said compound semiconductor thin-film layers; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through said second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of either InAs or InSb compound semiconductor, whereas the second type of said compound semiconductor thin-film layers are substantially composed of either InP or GaAs compound semiconductor;

wherein n-type impurities are doped only in the second type of said compound semiconductor thin-film layers.

3. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, a specific electron mobility which is less than that on the second type of the compound semiconductor thin-film layers in high electric field application, and causes impact ionization of valence electrons to occur at lower electric field application than the second type of said compound semiconductor thin-film layers; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through said second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of either InAs or InSb compound semiconductor, whereas the second type of said compound semiconductor thin-film layers are substantially composed of either InP or GaAs compound semiconductor; and wherein said first type of said compound semiconductor thin-film layers are substantially compound of InAs compound semiconductor, whereas the second type of said compound are substantially composed of InP compound semiconductor, where said first type of said compound semiconductor thin-film layers are provided with a certain thickness ranging from about 24Å to a maximum of about 75Å.

4. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, a specific electron mobility which is less than that of the second type of the compound semiconductor thin-film layers in high electric field application, and causes impact ionization of valence electrons to occur at lower electric field application than the second type of said compound semiconductor thin-film layers; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through the second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of either InAs or InSb compound semiconductor, whereas the second type of said compound semiconductor thin-film layers are substantially composed of either InP or GaAs compound semiconductor; and wherein said first type of said compound semiconductor thin-film layers are substantially composed of InAs compound semiconductor, whereas the second type of said compound semiconductor thin-film layers are substantially composed of GaAs compound semiconductor, where said first type of said compound semiconductor thin-film layers are provided with a certain thickness ranging from about 24Å to a maximum of about 60Å.

5. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, a specific electron mobility which is less than that of the second type of the compound semiconductor thin-film layers in high electric field application, and causes impact ionization of valence electrons to occur at lower electric field application than the second type of said compound semiconductor thin-film layers; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through the second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of either InAs or InSb compound semiconductor, whereas the second type of said compound semiconductor thin-film layers are substantially composed of $InAs_yP_{1-y}(0<y<1.0)$ compound semiconductor mixed crystal.

6. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, a specific electron mobility which is less than that of the second type of the compound semiconductor thin-film layers in high electric field application, and causes impact ionization of valence electrons to occur at lower electric field application than the second type of said compound semiconductor thin-film layers; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through said the second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of $InAs_yP_{1-y}(0.5<y<1.0)$ of compound semiconductor mixed crystal, whereas the second type of said compound semiconductor thin-film layers are substantially composed of $InAs_yP_{1-y}(0<y<0.5)$ compound semiconductor mixed crystal.

7. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, a specific electron mobility which is less than that of the second type of the compound semiconductor thin-film layers at lower electric field application; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through said second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of either InAs or InSb compound semiconductor, whereas the second type of said compound semiconductor thin-film layers are substantially composed of InP compound semiconductor.

8. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application and causes impact ionization of valence electrons to occur at lower electric field application than the second type of said compound semiconductor thin-film layers; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through said second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of either InAs or InSb compound semiconductor, whereas the second type of said compound semiconductor thin-film layers are substantially composed of InP compound semiconductor.

9. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, a specific electron mobility which is less than that of the second type of the compound semiconductor thin-film layers in high electric field application; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through the second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of either InAs or InSb compound semiconductor, whereas the second type of said compound semiconductor thin-film layers are substantially composed of $InAs_yP_{1-y}(0<y<1.0)$ compound semiconductor mixed crystal.

10. A compound semiconductor device incorporating a channel layer which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application and causes impact ionization of valence electrons to occur at lower electric field application than the second type of said compound semiconductor thin-film layers; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through the second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of either InAs or InSb compound semiconductor, whereas the second type of said compound semiconductor thin-film layers are substantially composed of $InAs_yP_{1-y}(0<y<1.0)$ compound semiconductor mixed crystal.

11. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, a specific electron mobility which is less than that of the second type of the compound semiconductor thin-film layers in high electric field application; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through said the second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of $InAs_yP_{1-y}(0.5<y<1.0)$ of compound semiconductor mixed crystal, whereas the second type of said compound semiconductor thin-film layers are substantially composed of $InAs_yP_{1-y}(0<y<0.5)$ compound semiconductor mixed crystal.

12. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application and causes impact ionization of valence electrons to occur at lower electric field application than the second type of said compound semiconductor thin-film layers; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through said the second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of $InAs_yP_{1-y}(0.5<y<1.0)$ of compound semiconductor mixed crystal, whereas the second type of said compound semiconductor thin-film layers are substantially composed of $InAs_yP_{1-y}(0<y<0.5)$ compound semiconductor mixed crystal.

13. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, a specific electron mobility which is less than that of the second type of the compound semiconductor thin-film layers in high electric field application; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through said second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of InSb compound semiconductor, whereas the second type of said compound semiconductor thin-film layers is substantially composed of GaAs compound semiconductor.

14. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, and caused impact ionization of valence electrons to occur at lower electric field application than the second type of said compound semiconductor thin-film layers; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through said second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of either InSb compound semiconductor, whereas the second type of said compound semiconductor thin-film layers are substantially composed of GaAs compound semiconductor.

15. A compound semiconductor device incorporating a channel layer coupled to a source electrode and a drain electrode and which is made of periodically layering compound semiconductor thin-film layers substantially being different from each other comprising;

a first type of said compound semiconductor thin-film layers having a specific energy difference between conduction band and valence band being less than that of a second type of said compound semiconductor thin-film layers, a specific electron mobility which is greater than that of the second type of said compound semiconductor thin-film layers in low electric field application, a specific electron mobility which is less than that of the second type of the compound semiconductor thin-film layers in high electric field application, and causes impact ionization of valence electrons to occur at lower electric field application than the second type of said compound semiconductor thin-film layers; and the second type of said compound semiconductor thin-film layers having a specific energy difference between conduction band and valence band being more than that of said first type of said compound semiconductor thin-film layers, a specific electron mobility which is greater than that of said first type of said compound semiconductor thin-film layers in high electric field application, allows conduction electrons to preferentially flow through said first type of said compound semiconductor thin-film layers in low electric field application and also conduction electrons highly energized by acceleration to preferentially flow through said second type of said compound semiconductor thin-film layers in high electric field application, and also allows conduction electrons highly energized by acceleration in high electric field application to move from said first type of said compound semiconductor thin-film layers to the second type of said compound semiconductor thin-film layers before said conduction electrons cause impact ionization of valence electrons and inter-valley scattering to occur in said conduction band inside of said first type of said compound semiconductor thin-film layers;

wherein said first type of said compound semiconductor thin-film layers are substantially composed of InSb compound semiconductor, whereas the second type of said compound semiconductor thin-film layers are substantially composed of GaAs compound semiconductor.

* * * * *

UNITED STATES PATENT AND TRADEMARK OFFICE
CERTIFICATE OF CORRECTION

PATENT NO. : 4,894,691

DATED : January 16, 1990

INVENTOR(S) : Yuichi Matsui

It is certified that error appears in the above—identified patent and that said Letters Patent is hereby corrected as shown below:

Column 13, line 12, "compound" (first instance) should read -- composed --.

Column 20, line 52, "caused" should read -- causes --.

Signed and Sealed this

Twentieth Day of August, 1991

*Attest:*

HARRY F. MANBECK, JR.

*Attesting Officer*      *Commissioner of Patents and Trademarks*